United States Patent
Gerhard et al.

(12) 
(10) Patent No.: US 6,836,379 B2
(45) Date of Patent: Dec. 28, 2004

(54) CATADIOPTRIC OBJECTIVE

(75) Inventors: Michael Gerhard, Aalen (DE);
Hans-Jochen Paul, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 124 days.

(21) Appl. No.: 10/117,943

(22) Filed: Apr. 8, 2002

(65) Prior Publication Data

US 2002/0196550 A1 Dec. 26, 2002

(30) Foreign Application Priority Data

Apr. 11, 2001 (DE) ........................................ 101 18 048

(51) Int. Cl.[7] ............................................. G02B 17/00
(52) U.S. Cl. ...................... 359/726; 359/629; 359/636; 359/637; 359/638; 359/732; 359/738; 359/820
(58) Field of Search ..................... 359/629, 636–638, 359/726, 732, 738, 820

(56) References Cited

U.S. PATENT DOCUMENTS

| | | | |
|---|---|---|---|
| 5,072,126 A | 12/1991 | Progler | 250/548 |
| 5,223,956 A | * 6/1993 | Kramer et al. | 359/17 |
| 5,742,436 A | 4/1998 | Fürter | 359/727 |
| 5,805,357 A | * 9/1998 | Omura | 359/727 |

* cited by examiner

*Primary Examiner*—Evelyn A. Lester
(74) *Attorney, Agent, or Firm*—Welsh & Katz, Ltd.

(57) ABSTRACT

A catadioptric objective is provided with a beam splitter surrounded at least partially by a mount, with a mirror, with a plurality of lenses and with a λ/4 plate arranged between the mirror and the beam splitter. Arranged between the beam splitter and the mount on the side on which false light emerges from the beam splitter is an absorption device that absorbs false light traversing the beam splitter

20 Claims, 1 Drawing Sheet

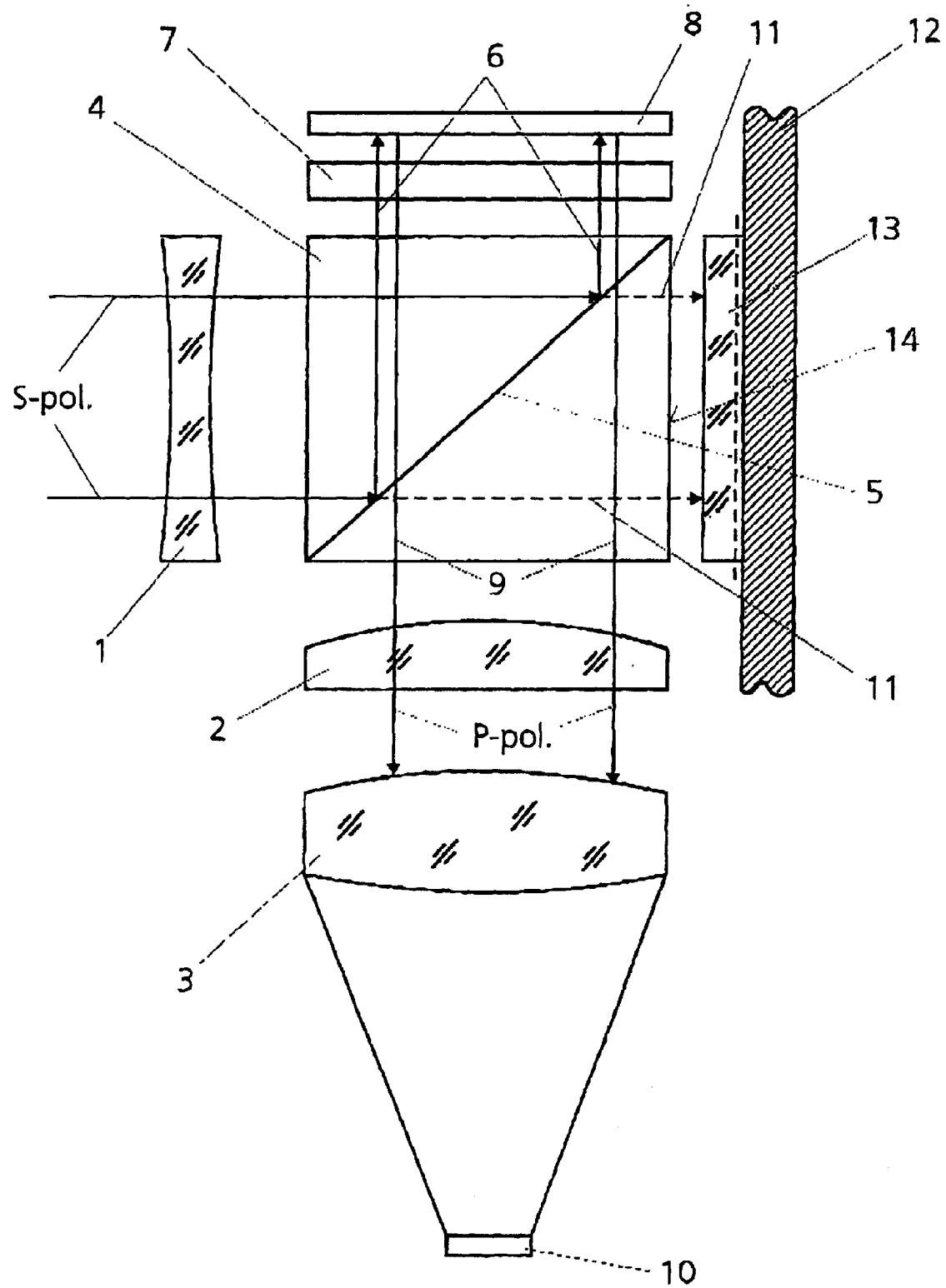

CATADIOPTRIC OBJECTIVE

BACKGROUND OF THE INVENTION

1. Field of the Invention

The invention relates to a catadioptric objective and more specifically it relates to a projection objective for semiconductor lithography comprising a beam splitter surrounded at least partially by a mount, comprising a mirror, comprising a plurality of lenses and comprising a λ/4 plate arranged between the mirror and the beam splitter.

Such an objective is described in DE 44 17 489 A1.

2. Description of the Related Art

The aim in theory is for no false light to be produced in the case of an objective of this type having a polarization beam splitter. It is known from the document mentioned at the beginning to direct incident s-polarized light in the beam path of the objective onto a beam splitter. In this case, 100% of the s-polarized light is reflected, subsequently rotated with the aid of a λ/4 plate and then reflected onto a mirror. The light reflected at the mirror strikes the beam splitter again and then passes in transmission, as p-polarized light, through the beam splitter in the direction of the image, for example a wafer, to be exposed.

In practice, however, the light passing through the beam splitter is not perfectly p-polarized, since all the optical elements in the objective exhibit stress birefringence. Moreover, in practice a beam splitter generally has a reflecting power of only 80% for the incident light. The light not reflected therefore passes through the beam splitter, strikes the mount situated therebehind and is then reflected to and fro in the objective until it subsequently strikes the object to be exposed, for example the wafer, as interfering scattered light Reference may be made in addition to U.S. Pat. No. 5,072,126 in relation to the general prior art.

SUMMARY OF THE INVENTION

It is the object of the present invention to create an objective structure that prevents interfering scattered light from being produced, in particular scattered light that strikes the object to be exposed.

This object is achieved according to the invention by means of a catadioptric objective, wherein arranged between the beam splitter and the mount on the side on which false light emerges from the beam splitter is an absorption device that absorbs the false light traversing the beam splitter.

According to the invention, there is now created for the portion of the incident light that is not reflected at the beam splitter but passes through the latter a type of beam trap in the form of an absorption device which prevents scattered light being formed by light reflected at the mount.

Fundamentally, the absorption device according Lo the invention can also be achieved by means of an appropriate design of the mount such as, for example, an antireflection layer and/or blackening at the region of the mount that is located on the side of the beam splitter opposite the incident light if the heating caused thereby can be mastered. This holds, for example, for a stainless steel surface, which yields a serious lowering of the reflection in the event of a coating, in particular in the wavelength ranges of 248, 193, 157 or 126 nm.

In general, tho false light will emerge on the side that is opposite the ray bundle incident in the beam splitter. However, it is also possible for false light to emerge on another side. All that is required in this case is also to provide an absorption device on the corresponding side.

In another advantageous refinement of the invention, the absorption device can be formed by a glass substrate. If, in this case, a glass substrate is selected which absorbs the light after a few millimeters, a space-saving design is created in this way which also does not produce temperature problems. This is the case, in particular, whenever the glass substrate is brought into a mechanical contact with the mount that transfers heat. The mount can then effectively dissipate the heat produced during the absorption, in particular when the mount is temperature-stabilized, that is to say provided with a heat dissipating means.

However, instead of a glass substrate it is also possible to arrange another absorption device between the beam splitter and the mount which is likewise, if appropriate, in mechanical contact with the mount that transfers heat.

In order for the beam trap to function satisfactorily, it is advantageous when the beam splitter is coated on the side averted from the beam input side so that reflection does not occur on the rear wall of the beam splitter itself.

Additional advantages of the present invention will become apparent to those skilled in the art from the following detailed description of exemplary embodiments of the present invention.

BRIEF DESCRIPTION OF THE DRAWINGS

The invention is explained below by way of example for a catadioptric projection objective for semi-conductor lithography. Since such an objective is generally known (see, for example, DE 44 17 489 A1), only the parts essential to the invention are described below in more detail.

DETAILED DESCRIPTION OF THE PREFERRED EMBODIMENT

The projection objective is known to have a plurality of lenses 1, 2 and 3 of which only three are illustrated in the drawing by way of example. Light incident through the lens 1 is s-polarized. It strikes a diagonally running beam splitter surface 5 arranged on a beam splitter designed as a beam splitter cube 4. The beam splitter surface 5 is firstly used in reflection and then in transmission. For this purpose, the incident s-polarized light is firstly reflected in accordance with the direction 6 of the arrow, traverses a λ/4 plate 7 in the process and is subsequently reflected at a mirror 8. After traversing the λ/4 plate 7 again, the light is p-polarized and passes through the beam splitter surface 5 in transmission in accordance with the arrows 9. After traversing the lenses 2 and 3, the p-polarized light then strikes a wafer 10 to be exposed.

However, this ideal state is not reached in practice to 100%. Rather, a portion of the incident light passes through the beam splitter surface 5 (see dashed arrows 11). Upon striking the objective mount 12 (illustrated only partially) or another part of the objective, the light beams would be at least partially reflected and then strike the wafer 10 as scattered light after multiple reflections.

In order to prevent this, an absorption device 13 in the form of a glass substrate is arranged between the beam splitter cube 4 on the side opposite the incident light beam and the objective mount 12. The absorption device 13 in this case has a spatial extent that corresponds at least in magnitude to the extent of the beam splitter cube 4 on the side averted from the incident light. The glass substrate has an antireflection coating on the entrance side and a thickness of a few millimeters. It is selected in this case such that the incident light has been absorbed to a very high degree after a few millimeters. A glass substrate should be selected if possible, approximately 99% of the incident beams already being absorbed after a substrate thickness of approximately 1 mm.

As a multilayer, the antireflection layer can consist of the materials $SiO_2$ and/or INCONEL alloy (CrNi alloy), or can have these constituents compounded with other materials.

As absorption device 13, the glass substrate will be chosen in this case as a function of the wavelength of the light. Thus, for example, in practice LLF glass (black glass, manufacturer: Schott, Mainz) has proved to be advantageous for a wavelength of 193 nm, and quartz, in particular Homosil quartz for a wavelength of 157 nm.

The absorption device 13 is in direct contact with the objective mount 12 so that the heat produced in the course of absorption can be dissipated. Objective mounts in semiconductor lithography are generally temperature-stabilized or provided with a cooling device such that no negative effects on the image quality are produced by the absorption device.

In order for the beam splitter cube 4 itself not to produce any scattered light, the surface 14 of the beam splitter 4 averted from the incident light will likewise be provided with an antireflection coating or be appropriately coated.

Of course, it is also possible within the scope of the invention to use other absorption devices instead of a glass substrate as absorption device 13.

In the simplest case, it may be sufficient for this purpose to provide the objective mount 12 with an antireflection coating (illustrated by dashes) in the region of the beam splitter 4 on the side of the objective mount 12 averted from the incident light.

What is claimed is:

1. A catadioptric objective comprising a beam splitter surrounded at least partially by a mount, and having a mirror, a plurality of lenses and a λ/4 plate arranged between the mirror and the beam splitter, wherein arranged between the beam splitter and the mount on the side on which false light emerges from the beam splitter is an absorption device that absorbs the false light traversing the beam splitter, said absorption device being on the side opposite the incident light in said beam splitter, and on said mount.

2. The objective as claimed in claim 1, wherein said absorption device is a glass substrate.

3. The objective as claimed in claim 2, wherein said glass substrate is provided as said absorption device with an antireflection coating.

4. The objective as claimed in claim 2, wherein said glass substrate is constructed such that at least 99% of the incident light is absorbed after approximately 1 mm of substrate thickness.

5. The objective as claimed in claim 1, wherein said absorption device is in mechanical contact with said mount that transmits heat.

6. The objective as claimed in claim 1, wherein the surface of said beam splitter averted from the incident light side has an anti-reflective coating.

7. The objective as claimed in claim 1, wherein said absorption device is formed by an antireflection coating on the region of said mount that is located on the side of said beam splitter opposite the incident light.

8. The objective as claimed in claim 7, wherein said antireflection coating comprises $SiO_2$.

9. The objective as claimed in claim 7, wherein said antireflection coating comprises a CrNi alloy.

10. A projection objective for semiconductor lithography comprising a beam splitter surrounded at least partially by a mount, and having a mirror, a plurality of lenses and a λ/4 plate arranged between the mirror and the beam splitter, wherein arranged between the beam splitter and the mount on the side on which false light emerges from the beam splitter is an absorption device for absorbing the false light traversing the beam splitter, said absorption device being in mechanical contact with said mount for transmitting heat.

11. The projection objective as claimed in claim 10, wherein said absorption device is arranged on the side opposite an incident light in said beam splitter, and on said mount.

12. The projection objective as claimed in claim 10, wherein said absorption device is a glass substrate.

13. The projection objective as claimed in claim 12, wherein said glass substrate is provided as said absorption device with an antireflection coating.

14. The projection objective as claimed in claim 12, wherein said glass substrate is constructed such that at least 99% of the incident light is absorbed after approximately 1 mm of substrate thickness.

15. The projection objective as claimed in claim 10, wherein the surface of said beam splitter averted from the incident light side has an anti-reflective coating.

16. The projection objective as claimed in claim 10, wherein said absorption device is formed by an antireflection coating on the region of said mount that is located on the side of said beam splitter opposite the incident light.

17. The projection objective as claimed in claim 16, wherein said antireflection coating comprises $SiO_2$.

18. The projection objective as claimed in claim 16, wherein said antireflection coating comprises a CrNi alloy.

19. A catadioptric objective comprising a beam splitter surrounded at least partially by a mount, and having a mirror, a plurality of lenses and a λ/4 plate arranged between the mirror and the beam splitter, wherein arranged between the beam splitter and the mount on the side on which false light emerges from the beam splitter is an absorption device comprising a glass substrate that absorbs the false light traversing the beam splitter.

20. A projection objective for semiconductor lithography comprising a beam splitter surrounded at least partially by a mount, and having a mirror, a plurality of lenses and a λ/4 plate arranged between the mirror and the beam splitter, wherein arranged between the beam splitter and the mount on the side on which false light emerges from the beam splitter is an absorption device comprising a glass substrate that absorbs the false light traversing the beam splitter.

* * * * *

UNITED STATES PATENT AND TRADEMARK OFFICE
CERTIFICATE OF CORRECTION

PATENT NO. : 6,836,379 B2  
DATED : December 28, 2004  
INVENTOR(S) : Michael Gerhard It is certified that error appears in the above-identified patent and that said Letters Patent is hereby corrected as shown below:

Title page,
Item [57], ABSTRACT,
Line 7, delete "beam splitter" insert -- beam splitter. --

Column 1,
Line 34, delete "to and fro in the objective" insert -- to and from in the objective --
Line 36, delete "light" and insert -- light. --
Line 56, delete "according Lo the invention" insert -- according to the invention --
Line 66, delete "In general, tho false light" insert -- In general, the false light --

Column 3,
Line 9, delete "INCONEL alloy (CrNi alloy)" insert -- INCONEL (CrNi alloy) --

Signed and Sealed this

Seventeenth Day of May, 2005

JON W. DUDAS
*Director of the United States Patent and Trademark Office*